(12) United States Patent
Zhao

(10) Patent No.: US 10,439,137 B2
(45) Date of Patent: Oct. 8, 2019

(54) PIXEL PRINT STRUCTURE, MANUFACTURING METHOD THEREOF, DISPLAY DEVICE, INKJET PRINTING METHOD

(71) Applicant: BOE TECHNOLOGY GROUP CO., LTD., Beijing (CN)

(72) Inventor: Dejiang Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 111 days.

(21) Appl. No.: 15/555,051

(22) PCT Filed: Mar. 3, 2017

(86) PCT No.: PCT/CN2017/075562
§ 371 (c)(1),
(2) Date: Aug. 31, 2017

(87) PCT Pub. No.: WO2018/032746
PCT Pub. Date: Feb. 22, 2018

(65) Prior Publication Data
US 2018/0261767 A1    Sep. 13, 2018

(30) Foreign Application Priority Data
Aug. 15, 2016 (CN) .......................... 2016 1 0665936

(51) Int. Cl.
*H01L 51/00* (2006.01)
*H01L 51/56* (2006.01)
(Continued)

(52) U.S. Cl.
CPC ...... *H01L 51/0005* (2013.01); *H01L 27/3246* (2013.01); *H01L 27/3283* (2013.01); *H01L 51/5203* (2013.01); *H01L 51/56* (2013.01)

(58) Field of Classification Search
CPC ............. H01L 51/0005; H01L 27/3283; H01L 27/3246; H01L 51/5203; H01L 51/56
See application file for complete search history.

(56) References Cited

U.S. PATENT DOCUMENTS

2002/0109456 A1    8/2002   Morii et al.
2003/0059984 A1    3/2003   Sirringhaus et al.
(Continued)

FOREIGN PATENT DOCUMENTS

CN    1359253 A    7/2002
CN    1425204 A    6/2003
(Continued)

OTHER PUBLICATIONS

Office Action received for Chinese Patent Application No. 201610665936.5, dated Jul. 26, 2017, 25 pages (14 pages of English Translation and 11 pages of Office Action).
(Continued)

*Primary Examiner* — Karen Kusumakar
(74) *Attorney, Agent, or Firm* — Womble Bond Dickinson (US) LLP

(57) ABSTRACT

The present disclosure provides a pixel print structure, a manufacturing method thereof, a display device, and an inkjet printing method. The pixel print structure comprises a substrate, a first side wall and a second side wall located on the substrate, and an intermediate portion located between the first side wall and the second side wall, wherein the first side wall and the intermediate portion define a first area, and the second side wall and the intermediate portion define a second area.

18 Claims, 2 Drawing Sheets

(51) Int. Cl.
*H01L 51/52* (2006.01)
*H01L 27/32* (2006.01)

(56) References Cited

U.S. PATENT DOCUMENTS

| | | | | |
|---|---|---|---|---|
| 2007/0194326 | A1* | 8/2007 | Huh | H01L 27/1214 |
| | | | | 257/79 |
| 2010/0295036 | A1 | 11/2010 | Tsai et al. | |
| 2014/0197396 | A1* | 7/2014 | Madigan | H01L 51/0005 |
| | | | | 257/40 |
| 2016/0247862 | A1* | 8/2016 | Song | H01L 27/3246 |
| 2016/0359112 | A1 | 12/2016 | Wang et al. | |
| 2017/0213878 | A1 | 7/2017 | Song et al. | |

FOREIGN PATENT DOCUMENTS

| | | | |
|---|---|---|---|
| CN | 102226998 | A | 10/2011 |
| CN | 104167430 | A | 11/2014 |
| CN | 104377311 | A | 2/2015 |
| CN | 104465671 | A | 3/2015 |
| CN | 104904015 | A | 9/2015 |
| CN | 105140236 | A | 12/2015 |
| CN | 106207012 | A | 12/2016 |
| JP | 2013-077388 | * | 4/2013 |
| JP | 2013-077388 | A | 4/2013 |

OTHER PUBLICATIONS

International Search Report received for PCT Patent Application No. PCT/CN2017/075562, dated Jun. 5, 2017, 9 pages (4 pages of English Translation and 5 pages of Original Document).

Office Action received for Chinese Patent Application No. 201610665936.5, dated Feb. 23, 2018, 7 pages (4 pages of English Translation and 3 pages of Office Action).

* cited by examiner

PIXEL PRINT STRUCTURE, MANUFACTURING METHOD THEREOF, DISPLAY DEVICE, INKJET PRINTING METHOD

RELATED APPLICATION

The present application is the U.S. national phase entry of PCT/CN2017/075562, with an international filing date of Mar. 3, 2017, which claims the benefit of Chinese Patent Application 201610665936.5, filed on Aug. 15, 2016, the entire disclosures of which are incorporated herein by reference.

FIELD

The present disclosure generally relates to the field of display technology, and more particularly to a pixel print structure, a display device comprising such a pixel print structure, a method of manufacturing such a pixel print structure, and an inkjet printing method using such a pixel print structure.

BACKGROUND

Organic light-emitting diode (OLED) display technology is a technology that realizes display using reversible color change generated by an organic semiconductor material under the driving of a current. An OLED display has advantages of being ultra-light and ultra-thin, having high brightness, large viewing angle, low voltage, low power consumption, fast response and high resolution, being anti-seismic and bendable, having low cost and simple process, using fewer raw materials, having high luminous efficiency and wide temperature range, and the like, and is hence considered to be the most promising new-generation display technology.

Currently, there are two common methods for making an organic functional material layer in an OLED display device, one of which is vapor deposition method and the other is inkjet printing method. The vapor deposition method can realize production of full-color samples of the OLED display device and can achieve an extremely high product resolution. However, the utilization rate of materials in the vapor deposition method is extremely low, resulting in a high cost of the OLED display device, thus affecting and restricting the development of the OLED display device.

On the other hand, an apparatus and process for manufacturing an OLED display device using the inkjet printing method become maturer, and gradually head for the edge of mass production. The utilization rate of materials in the inkjet printing method is high, thus said method can be used for producing large-sized full-color samples. However, limited to the structure and performance parameters of the existing inkjet printing apparatus, it is not easy for the inkjet printing method to realize high-resolution printing in small- and medium-sized display devices.

SUMMARY

It is an objective of the present disclosure to provide an improved pixel print structure, a display device comprising such a pixel print structure, a method of manufacturing such a pixel print structure, and an inkjet printing method using such a pixel print structure.

According to an aspect of the present disclosure, there is provided a pixel print structure. The pixel print structure comprises a substrate, a first side wall and a second side wall located on the substrate, and an intermediate portion located between the first side wall and the second side wall. The first side wall and the intermediate portion define a first area, and the second side wall and the intermediate portion define a second area.

As used in the present disclosure, the "pixel print structures" refer to structures which are in one-to-one correspondence with pixel units in a display device and are configured to hold ink (e.g. an organic functional material of an OLED display device) above first electrodes of corresponding pixel units. The ink forms a functional layer in the display device after being dried.

In the pixel print structure provided by the present disclosure, the pixel print structure is divided to include the first area and the second area, and the division between the first area and the second area is adapted according to parameters of an inkjet printing apparatus and resolution of the display device to be made, which can realize production of a high-resolution product without modifying the existing inkjet printing apparatus.

In some embodiments, the first area is an ink printing area, and the second area is an ink storage area.

In such a pixel print structure, the ink injected into the ink printing area is configured to form a functional layer of a single pixel unit, and excess ink ejected by a nozzle at a single time can be stored in the ink storage area. Therefore, by using the pixel print structure provided by embodiments of the present disclosure, it is possible to realize the production of a high-resolution product without modifying the existing inkjet printing apparatus.

In some embodiments, both the first and second areas are ink printing areas.

In some embodiments, the height of the intermediate portion is lower than those of the first side wall and the second side wall.

In such a pixel print structure, since the height of the intermediate portion is lower than those of the first side wall and the second side wall, the liquid level of the ink injected between the first side wall and the second side wall may be higher than the height of the intermediate portion, so that the ink is properly dispensed between the ink printing area and the ink storage area. By appropriately setting the spacing between the intermediate portion and the first side wall as well as the spacing between the intermediate portion and the second side wall, the amount of ink dispensed in the ink printing area can be adjusted to achieve a desired resolution of the display device.

In some embodiments, the pixel print structure further comprises a first abutment portion formed on the substrate against a surface of the first side wall facing the second side wall, a second abutment portion formed on the substrate against a surface of the second side wall facing the first side wall, and an intermediate bottom portion formed between the intermediate portion and the substrate.

In such an embodiment, when the solvent of the ink injected into the pixel print structure is hydrophilic, surfaces of the first side wall, the second side wall and the intermediate portion may be hydrophobic, and surfaces of the first abutment portion, the second abutment portion and the intermediate bottom portion are hydrophilic. On the contrary, when the solvent of the ink injected into the pixel print structure is hydrophobic, the surfaces of the first side wall, the second side wall and the intermediate portion may be hydrophilic, and the surfaces of the first abutment portion, the second abutment portion and the intermediate bottom portion are hydrophobic.

In such a pixel print structure, the first side wall, the second side wall and the intermediate portion which have a hydrophobic-hydrophilic property opposite to that of the solvent of the ink are capable of "resisting" the ink so that the ink has a certain "shape", thereby reducing or even eliminating further flow of the ink after dispensation.

Further, in such a pixel print structure, the first abutment portion, the second abutment portion and the intermediate bottom portion which have the same hydrophobic-hydrophilic property as the solvent of the ink are arranged such that the ink dispensed in the ink printing area and the ink storage area forms a film uniformly on the substrate after drying, thereby improving the display quality of the display device.

According to another aspect of the present disclosure, there is provided a display device comprising an array substrate, a plurality of pixel print structures described above which are arranged on the array substrate, and ink that forms a film in respective pixel print structures. The pixel print structures are in one-to-one correspondence with pixel units of the array substrate.

In some embodiments, the first area is an ink printing area, the second area is an ink storage area, and the ink printing area of the pixel print structure corresponds to a first electrode region of a corresponding pixel unit.

In some embodiments, both the first area and the second area are ink printing areas, and the pixel print structure corresponds to the first electrode region of a corresponding pixel unit.

In the display device provided by the present disclosure, the pixel print structure is divided to include a first area and a second area, which can realize a high resolution without modifying the existing inkjet printing apparatus.

In some embodiments, the array substrate acts as a substrate for the respective pixel print structures.

In such a display device, the array substrate is multiplexed into a substrate of the pixel print structure, which can decrease the overall thickness of the display device, simplify the process flow, and reduce the manufacturing cost.

According to a further aspect of the present disclosure, there is provided a method of manufacturing a pixel print structure. The method comprises forming a first side wall and a second side wall on a substrate, as well as an intermediate portion between the first side wall and the second side wall. The first side wall and the intermediate portion define a first area, and the second side wall and the intermediate portion define a second area.

In some embodiments, the first area is an ink printing area, and the second area is an ink storage area.

In some embodiments, both the first and second areas are ink printing areas.

In some embodiments, the first side wall, the second side wall and the intermediate portion are simultaneously made using a half-tone mask, and the height of the intermediate portion is lower than those of the first side wall and the second side wall.

In such a method, the first side wall, the second side wall and the intermediate portion are simultaneously made using a half-tone mask, which can simplify the process flow, thereby reducing the manufacturing cost.

In some embodiments, the first side wall, the second side wall, and the intermediate portion are made of a photoresist.

In some embodiments, the above method further comprises, prior to forming the first side wall, the second side wall, and the intermediate portion, forming a first abutment portion, a second abutment portion and an intermediate bottom portion on the substrate. The first abutment portion abuts against a surface of the first side wall facing the second side wall, the second abutment abuts against a surface of the second side wall facing the first side wall, and the intermediate bottom portion is sandwiched between the intermediate portion and the substrate.

According to yet another aspect of the present disclosure, there is provided an inkjet printing method. The inkjet printing method uses the pixel print structure described above for forming a functional layer in the display device. The method comprises: injecting ink between the first side wall and the second side wall; drying the ink so that it flows into the first area and the second area, respectively; continuing to dry the ink so that it forms a film on the substrate.

It is to be noted that all the aspects of the disclosure have similar or identical example implementations and benefits, which are not described here for simplicity.

These and other aspects of the present disclosure will be apparent from and will be elucidated with reference to the embodiments described hereinafter.

DETAILED DESCRIPTION

Figure 1:
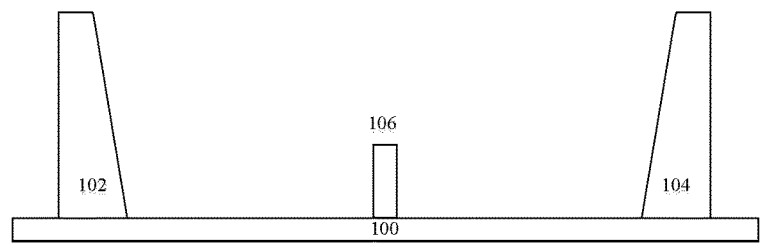
FIG. 1 schematically illustrates a sectional view of a pixel print structure according to embodiments of the present disclosure.

Exemplary embodiments of the present disclosure will be described in detail below with reference to the accompanying drawings. The drawings are schematic and not drawn to scale, which are merely illustrative of the embodiments of the present disclosure and are not intended to limit the scope of the present disclosure. In the drawings, the same reference numerals denote the same or similar parts. In order to clarify the technical solution of the present disclosure, the process steps and device structures well known in the art are omitted here.

Hereinafter, specific examples according to embodiments of the present disclosure will be described by way of example with reference to the accompanying drawings. The drawings are schematic and not drawn to scale, which are merely illustrative of the embodiments of the present disclosure and are not intended to limit the scope of the present disclosure.

For ease of description, spatially relative terms such as "under", "below", "lower", "above", "upper" and the like may be used herein to describe the relationship between one element or component and another element or component as shown in the drawings. It is to be understood that the spatially relative terms are intended to summarize different orientations of devices in use or operation other than those shown in the drawings. For example, if a device in the drawings is turned over, the elements described as being "under" or "below" other elements or components will be "above" other elements or components. In this way, the exemplary term "below" can cover two orientations of "under" and "above". The device may take other orientations (which is rotated 90 degrees or in other orientations), and the spatially relative descriptors used here are interpreted accordingly.

It is to be noted that although the following embodiments illustrate the present disclosure using an OLED display device as an example, as will be appreciated by those skilled in the art, the present disclosure may be applied to any display device capable of making a functional layer using an inkjet printing method, which is not limited to the OLED display device.

One currently known display device having high resolution is called a retinal display device. The so-called retinal display device means that when the resolution of the display device reaches 300 ppi, it is difficult for human eyes to distinguish a single pixel unit in the display screen. Thus, the pixel print structure provided by the present disclosure is analyzed theoretically based on the example of 300 ppi resolution. It is known that a typical size of a pixel unit is 70×25 μm at 300 ppi resolution. In an OLED display device, a typical aperture ratio is 40% of the area of a pixel unit. Assuming that the thickness of the organic functional layer formed after drying ink is 300 Å and the concentration of the ink used is 1%, and taking into account the climbing problem of the ink during the injection process, the volume of ink required for forming the organic functional layer of a single pixel unit is approximately 4 pL.

However, the minimum single injection amount of a relatively mature nozzle of the existing inkjet printing apparatus is 10 pL, which is substantially greater than the volume of ink required by a single pixel unit. Obviously, in the case where no improvement is made, the existing inkjet printing apparatus cannot realize the production of a high-resolution OLED display device.

The inventors also recognize that the area of 10 pL ink dropping onto a surface is about 1200 μm², whereas the area of a single pixel unit is 70×25 μm=1750 μm². It can be seen that, although a 10 pL nozzle cannot be used to eject the ink required by the organic functional layer of a single pixel unit, a single pixel unit can accommodate all the ink ejected by a 10 pL nozzle at a single time.

Accordingly, there is proposed a pixel print structure. As shown in FIG. 1, the pixel print structure comprises a substrate 100, a first side wall 102 and a second side wall 104 located on the substrate 100, and an intermediate portion 106 located between the first side wall 102 and the second side wall 104. The first side wall 102 and the intermediate portion 106 define a first area, and the second side wall 104 and the intermediate portion 106 define a second area.

The division between the first area and the second area and the functions thereof depend on the relationship between the amount of ink ejected by the nozzle and the amount of ink required by the pixel unit. When the amount of ink ejected by the nozzle is greater than the amount of ink required by the pixel unit, the first area is an ink printing area and the second area is an ink storage area. When the amount of ink ejected by the nozzle is equal to the amount of ink required by the pixel unit, the first area and the second area are both ink printing areas.

When the pixel print structure provided by the present disclosure comprises an ink printing area and an ink storage area, ink (e.g. 4 pL) injected into the ink printing area is configured to form an organic functional layer of a single pixel unit, while excess ink (e.g. 6 pL) ejected by the nozzle at a single time may be stored in the ink storage area. Therefore, by using the pixel print structure provided by embodiments of the present disclosure, it is possible to realize the production of a high-resolution product without modifying the existing inkjet printing apparatus.

Optionally, as shown in FIG. 1, the height of the intermediate portion 106 is lower than the height of the first side wall 102 and the height of the second side wall 104. Since the height of the intermediate portion 106 is lower than the height of the first side wall 102 and the height of the second side wall 104, the liquid level of the ink injected between the first side wall 102 and the second side wall 104 may be higher than the height of the intermediate portion 106, so that the ink is properly dispensed between the ink printing area and the ink storage area. By appropriately setting the spacing between the intermediate portion 106 and the first side wall 102 as well as the spacing between the intermediate portion 106 and the second side wall 104, the amount of ink dispensed in the ink printing area can be adjusted to achieve a desired resolution of the display device.

Figure 2:
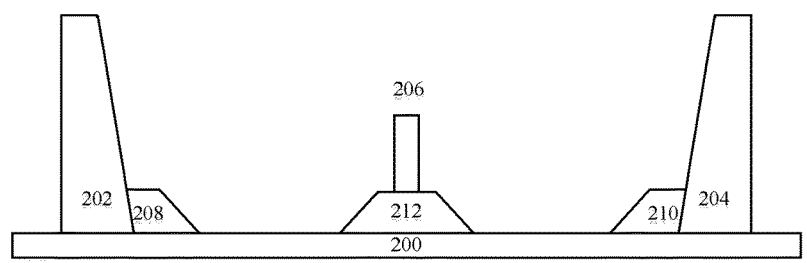
FIG. 2 schematically illustrates a sectional view of a pixel print structure according to embodiments of the present disclosure.

FIG. 2 schematically illustrates a sectional view of a pixel print structure according to another embodiment of the present disclosure. As shown in FIG. 2, in addition to a substrate 200, a first side wall 202 and a second side wall 204 located on the substrate 200, and an intermediate portion 206 located between the first side wall 202 and the second side wall 204, the pixel print structure further comprises a first abutment portion 208 formed on the substrate 200 against a surface of the first side wall 202 facing the second side wall 204, a second abutment portion 210 formed on the substrate 200 against a surface of the second side wall 204 facing the first side wall 202, and an intermediate bottom portion 212 formed between the intermediate portion 206 and the substrate 200.

In such an embodiment, when the solvent of the ink injected into the pixel print structure is hydrophilic, surfaces of the first side wall 202, the second side wall 204 and the intermediate portion 206 are hydrophobic, and surfaces of the first abutment portion 208, the second abutment portion 210 and the intermediate bottom portion 212 are hydrophilic. On the contrary, when the solvent of the ink injected into the pixel print structure is hydrophobic, the surfaces of the first side wall 202, the second side wall 204 and the intermediate portion 206 are hydrophilic, and the surfaces of the first abutment portion 208, the second abutment portion 210 and the intermediate bottom portion 212 are hydrophobic.

The first side wall 202, the second side wall 204 and the intermediate portion 206 which have a hydrophobic-hydrophilic property opposite to that of the solvent of the ink are capable of resisting the ink so that the ink has a certain "shape", thereby reducing or even eliminating further flow of the ink after the dispensation.

The first abutment portion 208, the second abutment portion 210 and the intermediate bottom portion 212 which have the same hydrophobic-hydrophilic property as the solvent of the ink are arranged such that the ink dispensed in the ink printing area and the ink storage area forms a film uniformly on the substrate after drying, thereby improving the display quality of the display device.

Figure 3:
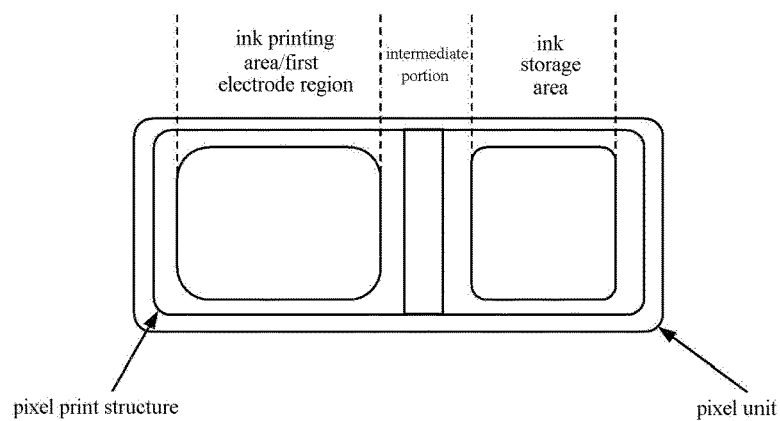
FIG. 3 schematically illustrates the relationship between a pixel print structure and a pixel unit according to embodiments of the present disclosure.

The present disclosure further provides a display device comprising an array substrate, a plurality of pixel print structures described above which are arranged on the array substrate, and ink that forms a film in respective pixel print structures. FIG. 3 schematically illustrates the relationship between a pixel print structure and a pixel unit according to embodiments of the present disclosure. As shown in FIG. 3, the pixel print structure corresponds to the pixel unit, and the ink printing area of the pixel print structure corresponds to the first electrode region of the pixel unit.

Optionally, the array substrate acts as a substrate for the respective pixel print structures. In such a display device, the array substrate is multiplexed into a substrate of the pixel print structure, which can decrease the overall thickness of the display device, simplify the process flow, and reduce the manufacturing cost.

In addition, the present disclosure provides a method of manufacturing a pixel print structure. The method comprises forming a first side wall and a second side wall on a substrate, as well as an intermediate portion between the first side wall and the second side wall. The first side wall and the intermediate portion define an ink printing area, and the second side wall and the intermediate portion define an ink storage area.

In some embodiments, the first side wall, the second side wall and the intermediate portion are simultaneously made using a half-tone mask, and the height of the intermediate portion is lower than those of the first side wall and the second side wall. For example, the first side wall, the second side wall and the intermediate portion are made of a photoresist. In such a method, the first side wall, the second side wall and the intermediate portion are simultaneously made using the half-tone mask, which can simplify the process flow, thereby reducing the manufacturing cost.

In some embodiments, the above method further comprises, prior to forming the first side wall, the second side wall and the intermediate portion, forming a first abutment portion, a second abutment portion and an intermediate bottom portion on the substrate. The first abutment portion abuts against a surface of the first side wall facing the second side wall, the second abutment portion abuts against a surface of the second side wall facing the first side wall, and the intermediate bottom portion is sandwiched between the intermediate portion and the substrate.

Further, the present disclosure provides an inkjet printing method. The inkjet printing method uses the pixel print structure described above for forming a functional layer in a display device.

Figure 4A:
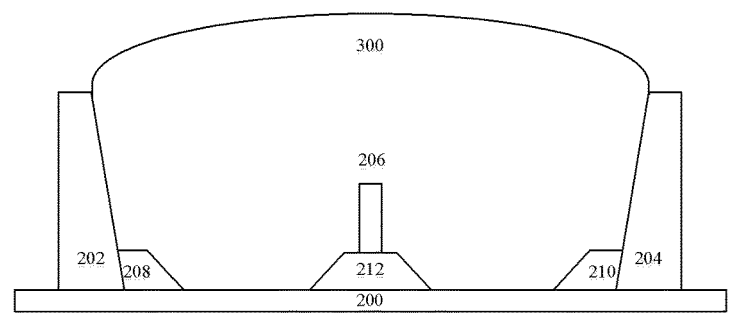
FIGS. 4(a)-4(c) schematically illustrate steps of an inkjet printing method according to embodiments of the present disclosure.
Figure 4B:
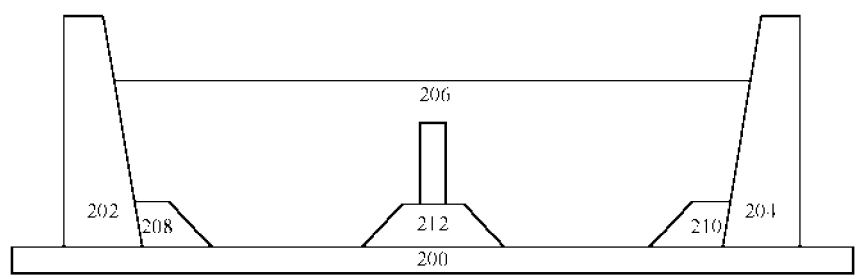
Figure 4C:
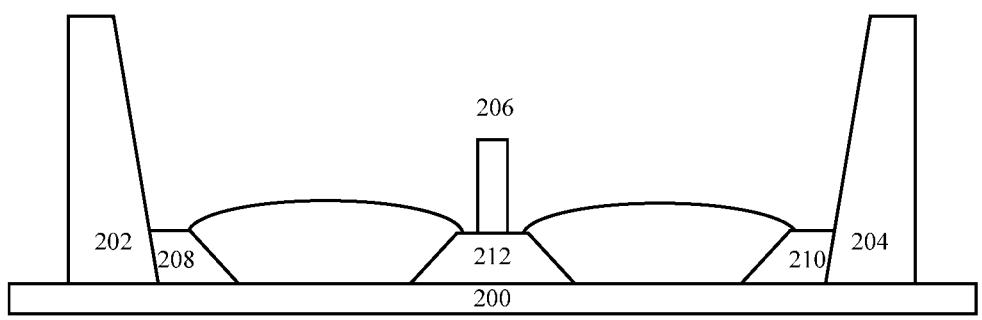

FIGS. 4(a)-4(c) schematically illustrate the steps of the method. First, as shown in FIG. 4(a), ink 300 is injected between the first side wall 202 and the second side wall 204. Then, as shown in FIG. 4(b), the ink is dried so that it flows into the first area and the second area, respectively. Finally, as shown in FIG. 4(c), the ink continues to be dried so that it forms a film on the substrate 200.

It is to be noted that although FIGS. 4(a)-4(c) illustrate the inkjet printing method according to embodiments of the present disclosure using the pixel print structure shown in FIG. 2 as an example, as will be appreciated by those skilled in the art, the inkjet printing method may use any of the pixel print structures provided by embodiments of the present disclosure.

The concept of the present disclosure can be widely applied to any system having display function, including a desktop computer, a laptop computer, a mobile phone, a tablet computer, and the like. In addition, although several embodiments have been described in detail above, other modifications are possible. For example, components may be added to the described system or removed from the described system. Other embodiments may be within the scope of the present disclosure. Numerous variations and modifications may be made by those skilled in the art without departing from the spirit and scope of the present disclosure in view of the teachings of the present disclosure.

The invention claimed is:

1. A pixel print structure comprising
a substrate;
a first side wall and a second side wall located on the substrate;
an intermediate portion located between the first side wall and the second side wall;
a first abutment portion formed on the substrate against a surface of the first side wall facing the second side wall;
a second abutment portion formed on the substrate against a surface of the second side wall facing the first side wall; and
an intermediate bottom portion formed between the intermediate portion and the substrate,
wherein the first side wall and the intermediate portion define a first area and the second side wall and the intermediate portion define a second area.

2. The pixel print structure according to claim 1, wherein the first area is an ink printing area, and the second area is an ink storage area.

3. The pixel print structure according to claim 1, wherein both the first area and the second area are ink printing areas.

4. The pixel print structure according to claim 1, wherein a height of the intermediate portion is lower than a height of the first side wall and a height of the second side wall.

5. The pixel print structure according to claim 1, wherein surfaces of the first side wall, the second side wall and the intermediate portion are hydrophobic.

6. The pixel print structure according to claim 5, wherein surfaces of the first abutment portion, the second abutment portion and the intermediate bottom portion are hydrophilic.

7. The pixel print structure according to claim 1, wherein surfaces of the first side wall, the second side wall and the intermediate portion are hydrophilic.

8. The pixel print structure according to claim 7, wherein surfaces of the first abutment portion, the second abutment portion and the intermediate bottom portion are hydrophobic.

9. A display device comprising an array substrate, a plurality of pixel print structures according to claim 1 arranged on the array substrate, and ink that forms a film in respective pixel print structures, wherein the pixel print structures are in one-to-one correspondence with pixel units of the array substrate.

10. The display device according to claim 9, wherein the first area is an ink printing area and the second area is an ink storage area; and the ink printing area of the pixel print structure corresponds to a first electrode region of a corresponding pixel unit.

11. The display device according to claim 9, wherein both the first area and the second area are ink printing areas, and the pixel print structure corresponds to a first electrode region of a corresponding pixel unit.

12. The display device according to claim 9, wherein the array substrate acts as a substrate for the respective pixel print structures.

13. A method of manufacturing a pixel print structure, comprising:
forming a first abutment portion, a second abutment portion and an intermediate bottom portion on the substrate; and
forming a first side wall and a second side wall on a substrate, and an intermediate portion between the first side wall and the second side wall;
wherein
the first abutment portion abuts against a surface of the first side wall facing the second side wall, the second abutment portion abuts against a surface of the second side wall facing the first side wall, the intermediate bottom portion is sandwiched between the intermediate portion and the substrate, and the first side wall and the intermediate portion define a first area, and the second side wall and the intermediate portion define a second area.

14. The method according to claim 13, wherein the first area is an ink printing area, and the second area is an ink storage area.

15. The method according to claim 13, wherein both the first area and the second area are ink printing areas.

16. The method according to claim 13, wherein the first side wall, the second side wall, and the intermediate portion are simultaneously made using a half-tone mask, and a height of the intermediate portion is lower than a height of the first side wall and a height of the second side wall.

17. The method according to claim 16, wherein the first side wall, the second side wall, and the intermediate portion are made of a photoresist.

18. An inkjet printing method using the pixel print structure according to claim 1, the method comprising:

injecting ink between the first side wall and the second side wall, drying the ink so that the ink flows into the first area and the second area, respectively, continuing to dry the ink so that the ink forms a film on the substrate.

* * * * *